US006249749B1

(12) United States Patent
Tran et al.

(10) Patent No.: US 6,249,749 B1
(45) Date of Patent: Jun. 19, 2001

(54) METHOD AND APPARATUS FOR SEPARATION OF IMPULSIVE AND NON-IMPULSIVE COMPONENTS IN A SIGNAL

(75) Inventors: Vy Tran, Canton; Sheau-Fang Lei, Farmington Hills; Keng D. Hsueh, West Bloomfield, all of MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/140,072

(22) Filed: Aug. 25, 1998

(51) Int. Cl.[7] .................................................... G01R 13/00

(52) U.S. Cl. ................................ 702/66; 702/69; 702/71; 73/602; 324/76.11

(58) Field of Search ................................ 702/66, 70, 71, 702/73, 57, 69, 112, 124; 73/584, 602, 587; 706/20, 22; 600/437, 453, 443; 381/71.8; 324/76.11, 76.12

(56) References Cited

U.S. PATENT DOCUMENTS 5,461,655 10/1995 Vuylsteke et al. .
5,497,777 3/1996 Abdel-Malek et al. .
5,619,998 4/1997 Abdel-Malek et al. .
5,995,539 * 11/1999 Miller .................................. 375/222
5,995,868 * 11/1999 Dorfmeister et al. ............... 600/544

OTHER PUBLICATIONS

XP–002122333, Conference Article, "Denoising using wavelet packets and the kurtosis: application to transient detection"; P. Ravier.

XP–000804652, Denoising of Low SNR Signals Using Composite Wavelet Shrinkage, R.S. Wong and V. K. Bhargava.

Combining an adapted wavelet analysis with fourth–order statistics for transient detection, P. Ravier, P–) Amblard.

* cited by examiner

*Primary Examiner*—Kamini Shah
*Assistant Examiner*—Hien Vo
(74) *Attorney, Agent, or Firm*—Mark L. Mollon

(57) ABSTRACT

Impulsive components and non-impulsive components within any time-domain signal such as audio, video, vibration, etc., are separated using wavelet analysis and sorting of wavelet coefficient sets according to statistical parameters of each respective coefficient set. Each entire coefficient set is either included or excluded from each respective separated component based on the statistical parameter. Thus, automatic, adaptive, flexible, and reliable separation of impulsive and non-impulsive components is achieved.

12 Claims, 3 Drawing Sheets

METHOD AND APPARATUS FOR SEPARATION OF IMPULSIVE AND NON-IMPULSIVE COMPONENTS IN A SIGNAL

BACKGROUND OF THE INVENTION

This application is related to commonly owned, copending U.S. application Ser. No. 09/140,071, entitled "Method and Apparatus for Identifying Sound in a Composite Sound Signal", which was filed concurrently herewith.

The present invention relates in general to separating impulsive and non-impulsive signal components within a time-domain signal, and more specifically to using wavelet transforms and sorting of wavelet coefficient sets to separate impulsive components from non-impulsive components of a time-domain signal.

Time-domain signals or waveforms may often include impulsive and non-impulsive components even though only one of these components may be of interest. For example, in either wireless or wired transmission of electrical or electromagnetic signals, interfering signals and background noise contaminate the signal as it travels through the wireless or wired transmission channel. The transmitted signal contains information, and therefore has primarily an impulsive character. The interference and background noise tends to be random and broadband, and therefore has primarily a non-impulsive character. After transmission, it would be desirable to separate the components so that the additive noise can be removed.

In other applications, sound waves may be converted to electrical signals for transmission or for the purpose of analyzing the sound to determine conditions that created the sound. If the sound is a voice intended for transmission, the picked-up sound may include an impulsive voice component and a non-impulsive background noise component. If the picked-up sound is created by operation of a machine or other environmental noise, the nature of the impulsive and/or non-impulsive sound components can be analyzed to identify specific noise sources or to diagnose or troubleshoot fault conditions of the machine, for example.

Prior art attempts to reduce unwanted noise and interference most often treat a signal as though the impulsive and non-impulsive components occupy different frequency bands. Thus, lowpass, highpass, and bandpass filtering have been used to try to remove an undesired component. However, significant portions of the components often share the same frequencies. Furthermore, these frequency bands of interest are not known or easily determined. Therefore, frequency filtering is unable to separate the components sufficiently for many purposes. Fourier analysis and various Fourier-based frequency-domain techniques have also been used in attempts to reduce undesired noise components, but these techniques also cannot separate components which share the same frequencies.

More recently, wavelet analysis has been used to de-noise signals. Wavelet transforms are similar in some ways to Fourier transforms, but differ in that the signal decomposition is done using a wavelet basis function over the plurality of time-versus-frequency spans, each span having a different scale. In a discrete wavelet transform, the decomposed input signal is represented by a plurality of wavelet coefficient sets, each set corresponding to a respective time-versus-frequency span. De-noising signals using wavelet analysis has been done in the prior art by adjusting the wavelet coefficient sets by thresholding and shrinking the wavelet coefficients prior to recovering a time-domain signal via an inverse wavelet transform. However, this technique has not resulted in the desired signals being separated to the degree necessary for many applications.

SUMMARY OF THE INVENTION

The present invention has the advantage of accurately separating impulsive and non-impulsive signal components in an adaptive and efficient manner.

In one aspect of the invention, a method of separating impulsive and non-impulsive signal components in a time-domain signal is comprised of decomposing the time-domain signal using a wavelet transform to produce a plurality of sets of wavelet coefficients. Each set of wavelet coefficients corresponds to a respective time-versus-frequency span. A respective statistical parameter is determined for each set of wavelet coefficients. A new time-domain signal is re-synthesized using an inverse wavelet transform applied to selected ones of the sets of wavelet coefficients. The selected ones are selected in response to the respective statistical parameters.

DETAILED DESCRIPTION OF PREFERRED EMBODIMENTS

Figure 1:
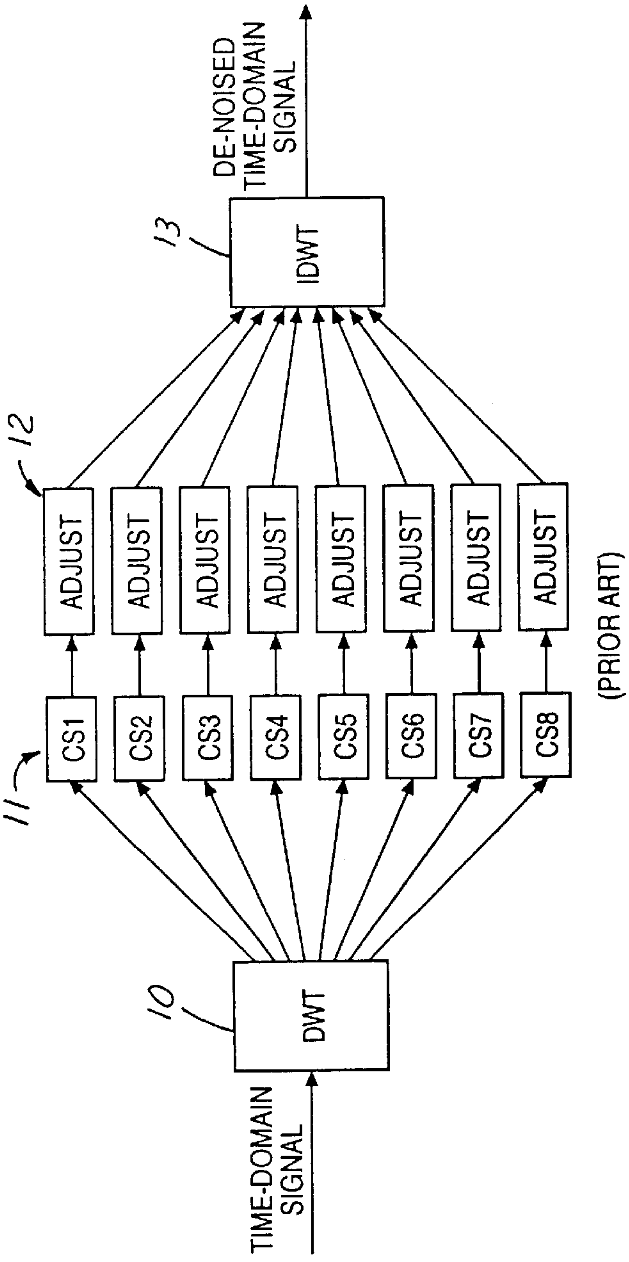
(PRIOR ART) FIG. 1
FIG. 1 is a functional block diagram showing a de-noising process of the prior art.

Wavelet analysis has been used in the past to remove noise from data using a technique called wavelet shrinkage and thresholding. A wavelet transform decomposes a signal into wavelet coefficients, some of which correspond to fine details of the input signal and others of which correspond to gross approximations of the input signal. Wavelet shrinkage and thresholding resets all coefficients to zero which have a value less than a threshold. This reduces the fine details which is where certain noise components may be represented. Thereafter, the modified coefficients are applied to an inverse transform to reproduce the input signal with some fine details missing, and therefore with a reduced noise level. As shown in FIG. 1, a time-domain signal is applied to a discrete wavelet transform (DWT) 10. As a result of the decomposition, a plurality of wavelet coefficient sets 11, individually designated as CS1 through CS8, are produced. Each coefficient set corresponds to a respective time-versus-frequency span and has a plurality of datapoint samples. The number and locations of the time-versus-frequency spans are selected to maximize performance in any particular application. Typically, the range between an upper and a lower frequency is divided geometrically (e.g., logarithmically) into the desired number of time-versus-frequency spans. The plurality of coefficient sets 11 are each adjusted according to the thresholding criteria of the wavelet shrinkage and thresholding technique in a plurality of adjustment blocks 12. The adjusted coefficient sets are provided to an inverse discrete wavelet transform (IDWT) 13 which reproduces a de-noised time-domain signal.

Figure 2:
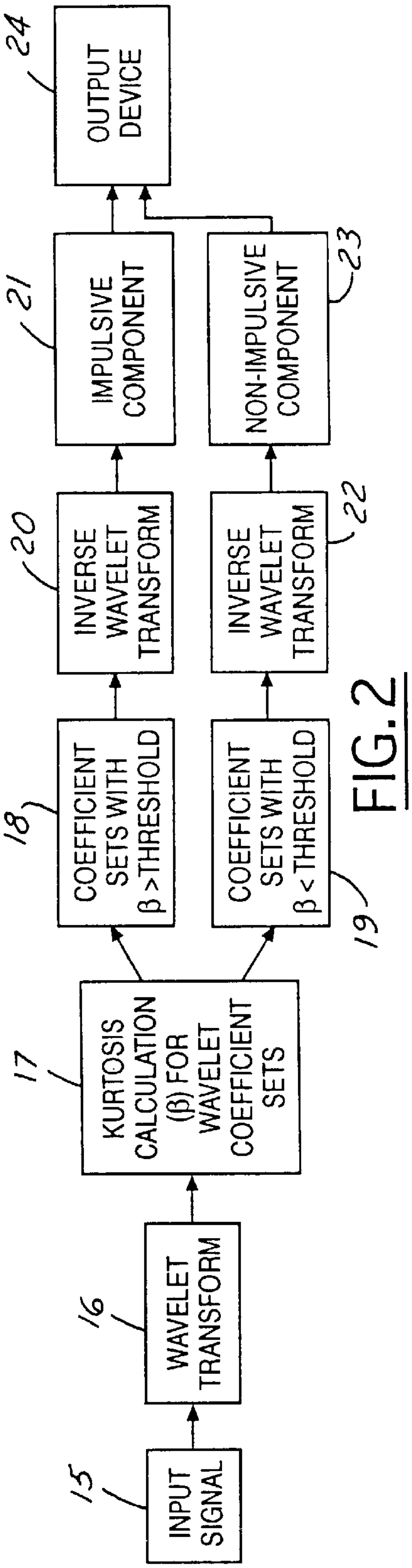
FIG. 2 is a functional block diagram showing an improved signal separation process of the present invention.

While the technique of FIG. 1 can be effective in reducing gaussian-type noise in a noisy data signal, the degree of signal separation obtained in certain applications (such as clearly separating impulsive and non-impulsive, non-gaussian components) is not fully achieved. Such signal separation is greatly improved using the present invention as shown generally in FIG. 2. A time-domain input signal 15 is input to a wavelet transform 16. A plurality of resulting wavelet coefficient sets are input to a kurtosis calculation 17. A kurtosis value β is determined for each of the wavelet coefficient sets according to the ratio of the fourth-order central moment to the squared second-order central moment of the individual coefficient values within each wavelet coefficient set. Each coefficient set has about the same number of datapoints as input signal 15. Each wavelet coefficient set corresponds to a different level or scale of the wavelet transform. Rather than modify values within each respective wavelet coefficient set as in the prior art, the present invention sorts the wavelet coefficient sets according to the respective kurtosis values or with respect to some other statistical parameter. Based upon this sorting of coefficient sets, the respective impulsive and non-impulsive components of the input signal are separated.

Thus, the wavelet coefficient sets are sorted into coefficient sets 18 having kurtosis values β greater than a predetermined kurtosis threshold and coefficient sets 19 having kurtosis values β less than the predetermined kurtosis threshold. Coefficient sets 18 are passed through an inverse wavelet transform 20 to reproduce the impulsive component 21. Coefficient sets 19 are passed through an inverse wavelet transform 22 to produce the non-impulsive component 23. Either or both of these signal components are coupled to an output device 24 which may include an audio transducer or a video display for reproducing audio and video signals, for example.

The kurtosis value is a preferred statistical parameter for separating the impulsive and non-impulsive components. However, other statistical parameters can be used such as mean, standard deviation, skewness, and variance. Furthermore, the threshold employed for separating the signal components may take on different values depending upon the signal sources. In general, a kurtosis threshold equal to about 5 provides good results.

Figure 3:
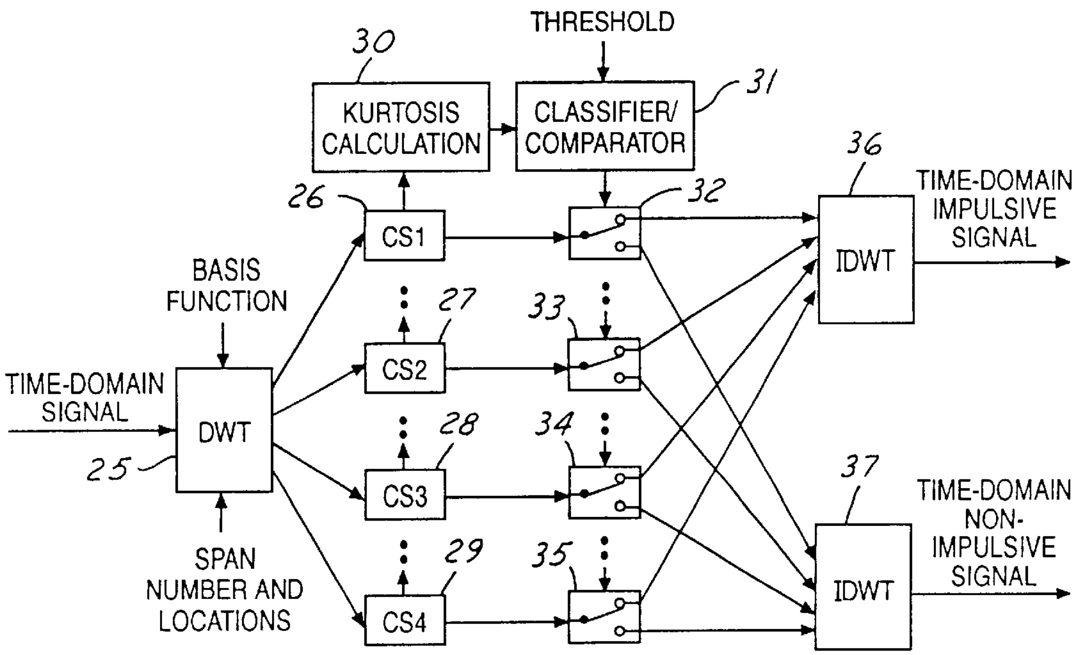
FIG. 3 is a block diagram showing an implementation of the present invention in greater detail.

A specific implementation of the present invention is shown in greater detail in FIG. 3. A time-domain signal having impulsive and non-impulsive components which are desired to be separated is input to a discrete wavelet transform (DWT) 25. A conventional DWT is employed. A selected basis function and the number of spans and locations for each time-versus-frequency span must be specified as is known in the art. A plurality of sets of wavelet coefficients CS1 through CS4 are generated in blocks 26–29. Typically, the number of time-versus-frequency spans is greater than four, but four are shown to simplify the drawing. In many applications, a span number of eight has been found to provide good performance.

CS1 block 26 is coupled to a kurtosis calculation block 30. The kurtosis value from kurtosis calculation block 30 is provided to a classifier/comparator 31. A predetermined threshold is also provided to classifier/comparator 31 and is compared with the kurtosis value. Depending upon the result of the comparison, classifier/comparator 31 controls a multiplex switch 32. The input of multiplex switch 32 receives coefficient set CS1. The switch output may be switched to either an impulsive IDWT 36 or a non-impulsive IDWT 37. Coefficient blocks 27–29 and multiplex switches 33–35 are each connected to respective identical kurtosis calculation blocks and classifier/comparator blocks (not shown). Thus, coefficient sets having a kurtosis value greater than the threshold are provided through their respective multiplex switches to the impulsive IDWT, thereby producing a time-domain impulsive signal. Coefficient sets having a kurtosis value less than the threshold are switched to non-impulsive IDWT 37 to produce a time-domain non-impulsive signal.

Figure 4:
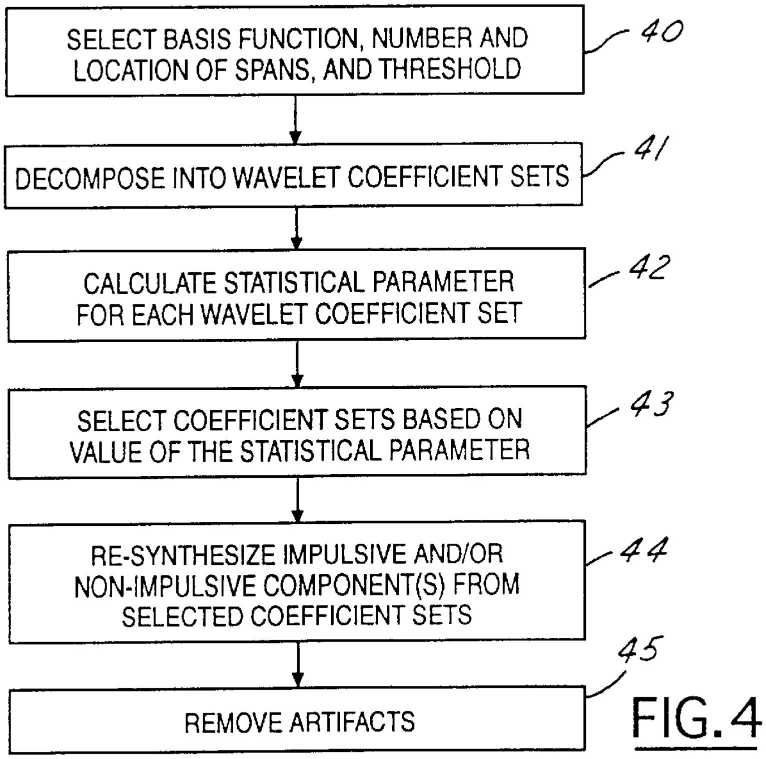
FIG. 4 is a flowchart showing a preferred method of the present invention.

A preferred embodiment of a method according to the present invention is shown in FIG. 4. In step 40, a basis function, the number and location of time-versus-frequency spans, and a predetermined threshold are selected for a particular application of impulsive and non-impulsive signal separation. One example of an appropriate basis function may be the Debauchies 40 basis function. A preferred number of time-versus-frequency spans is about eight, with the spans covering frequencies from zero to 22 kHz (using a common sampling rate of 44 kHz for audio signals). The spans are arranged geometrically and do not cover equal frequency ranges. For example, a first span may cover from 11 kHz to 22 kHz. A second span covers from 5.5 kHz to 11 kHz, and so on. A preferred value for a kurtosis threshold may be equal to about five.

In step 41, the input signal data is decomposed into the wavelet coefficient sets. A statistical parameter is calculated in step 42 for each respective wavelet coefficient set. In a preferred embodiment, the standard mathematical function of calculating a kurtosis value is employed using the individual coefficient values within a wavelet coefficient sets as inputs to the calculation. The output of the calculation is a single kurtosis value for the coefficient set. In step 43, wavelet coefficient sets are selected or sorted based on their respective values of the statistical parameter. The preferred embodiment is comprised of selecting the ones of the sets of wavelet coefficients which all have a kurtosis value either greater than or less than the kurtosis threshold, depending upon whether the impulsive or non-impulsive component is desired for reconstruction. In step 44, that component, or both, are re-synthesized from the selected coefficient sets by applying the selected coefficient sets to an inverse wavelet transform. In other words, all the wavelet coefficients within wavelet coefficient sets not to be included in a particular inverse transform are set to zero.

After re-synthesis, signal artifacts may have been introduced since the inverse wavelet transform is processed with truncated (i.e., set to zero) data. A typical artifact is an erroneously increased output value at either end of the time-domain signal. Thus, in step 45 artifacts are removed by throwing away the endpoint samples in the re-synthesized time-domain signal.

Figure 5:
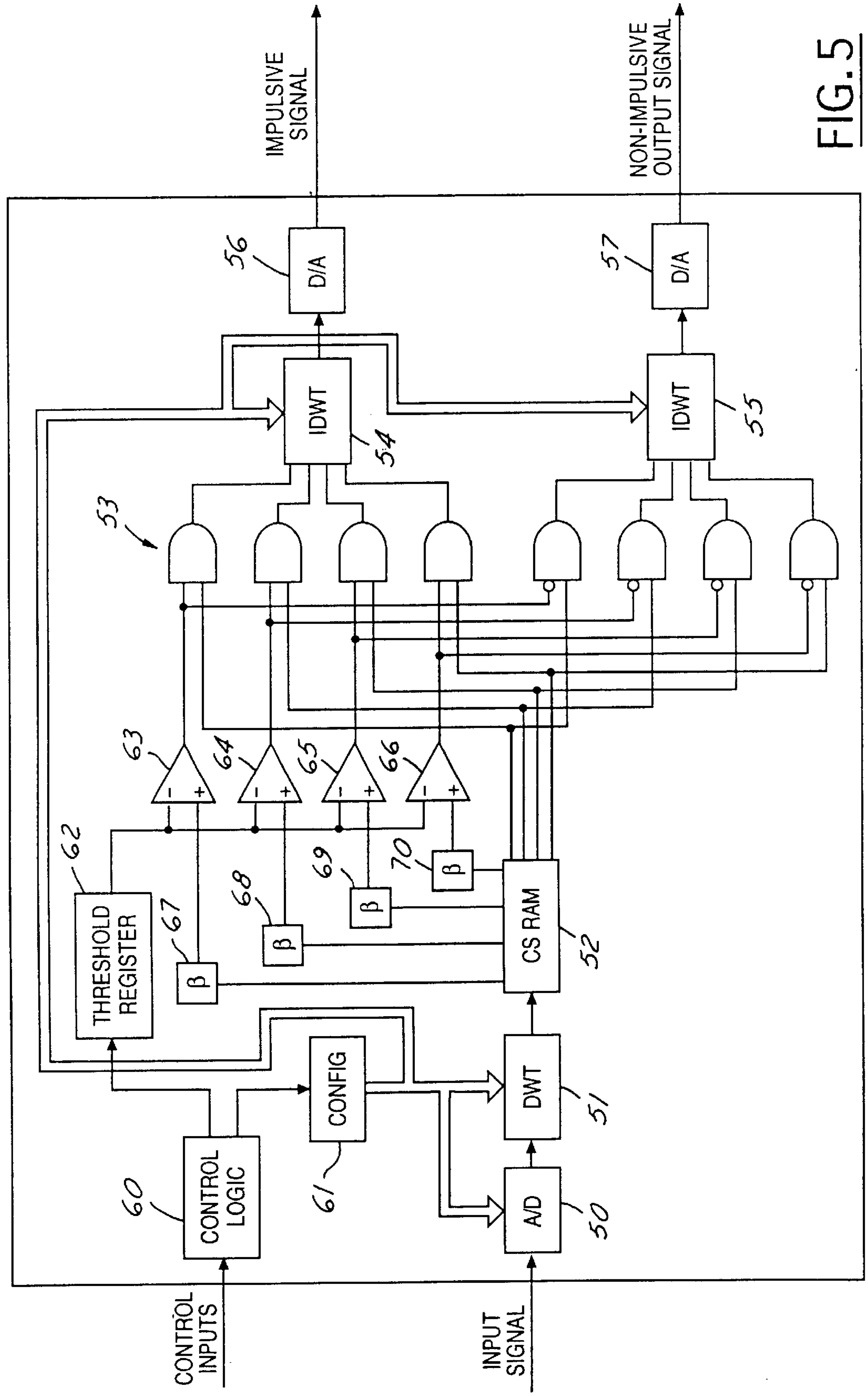
FIG. 5 is a schematic block diagram showing customized hardware for implementing the present invention.

The present invention may preferably be implemented using digital signal processing (DSP) programmable general purpose processors or specially designed application specific integrated circuits (ASICs), for example. FIG. 5 shows a functional block diagram for implementation with either a general purpose DSP or an ASIC. An input signal is provided to an analog-to-digital converter 50. The input signal may be digitized at a sampling frequency $f_s$ of about 44 kHz, for example. The digitized signals are provided to a discrete wavelet transform (DWT) 51. After decomposition, DWT 51 provides a plurality of wavelet coefficient sets to a coefficient-set random access memory (CSRAM) 52. The coefficient sets from CSRAM 52 are provided to a bank of transmission gates 53 comprised of AND-gates. Each coefficient set is coupled to two transmission gates which are inversely controlled as described below. The outputs of each pair of transmission gates are respectively connected to either IDWT 54 or IDWT 55. IDWT 54 provides the impulsive output signal after passing the inverse transform signal through a digital-to-analog converter 56. The output of IDWT 55 is connected to a digital-to-analog converter 57 which provides the non-impulsive signal.

Various control inputs are provided to a control logic block 60. Through these control inputs, a user can specify various parameters for the wavelet-based signal separation including the basis wavelet function, the number and location of time-versus-frequency spans, the threshold value, and other parameters such as the sampling rate to be used. The transform-related parameters are provided to a configuration block 61 which configures DWT 51 and IDWT's 54 and 55.

Control logic 60 also provides the threshold value to a threshold register 62. The threshold value is provided from threshold register 62 to the inverting inputs of a plurality of comparators 63–66. The non-inverting inputs of comparators 63–66 receive kurtosis values β for respective coefficient sets from a plurality of kurtosis calculators 67–70, respectively. The output of each comparator controls a pair of transmission gates which correspond to the coefficient set for which the comparator also receives the respective kurtosis value. The comparator output is inverted at the input to one transmission gate so that the respective coefficient set is coupled to only one of the IDWTs 54 or 55. Thus, the impulsive and non-impulsive signal components are separated and are available at the outputs of the DSP or ASIC and may be selectively used for any desired application.

Based on the foregoing, the present invention automatically detects and separates impulsive signal components (such as static noises in communication signals or road-induced squeaks and rattles in automobiles) from non-impulsive components (such as background noise) for any types of signals using a predetermined threshold. The invention is adaptive to different types of signals and threshold levels. The invention achieves fast processing speed and may be implemented using general or customized integrated circuits. The invention may be used to identify and separate out impulsive noise signatures reflecting abnormalities of machine operations (e.g., bearing failure, quality control issues, etc.). The invention is also useful in communication, medical imaging and other applications where other impulsive noises or information need to be separated such as in the isolation of static noises, extraneous noises, vibrations or disturbances, and others.

What is claimed is:

1. A method of separating impulsive and non-impulsive signal components in a time-domain signal, comprising the steps of:

decomposing said time-domain signal using a wavelet transform to produce a plurality of sets of wavelet coefficients, each set of wavelet coefficients corresponding to a respective time/frequency span;

determining a respective kurtosis value for each set of wavelet coefficients wherein said kurtosis value is determined for each of the wavelet coefficient sets as a function of the coefficient values within each wavelet coefficient set; and re-synthesizing a new time-domain signal using an inverse wavelet transform applied to selected ones of said sets of wavelet coefficients, said selected ones being selected in response to said respective kurtosis values.

2. The method of claim 1 wherein said selected ones of said sets of wavelet coefficients are determined by comparing each respective kurtosis value with a predetermined kurtosis threshold.

3. The method of claim 2 wherein said predetermined kurtosis threshold is equal to about 5.

4. A method of removing non-impulsive signal components from a time-domain signal, comprising the steps of:

decomposing said time-domain signal using a wavelet transform to produce a plurality of sets of wavelet coefficients, each set of wavelet coefficients corresponding to a respective time/frequency span;

determining a respective kurtosis value for each set of wavelet coefficients wherein said kurtosis value is determined for each of the wavelet coefficient sets as a function of the coefficient values within each wavelet coefficient set;

comparing each respective kurtosis value with a predetermined kurtosis threshold; and re-synthesizing a new time-domain signal using an inverse wavelet transform applied to selected ones of said sets of wavelet coefficients for which said respective kurtosis values are greater than said predetermined kurtosis threshold.

5. A method of removing impulsive signal components from a time-domain signal, comprising the steps of:

decomposing said time domain signal using a wavelet transform to produce a plurality of sets of wavelet coefficients, each set of wavelet coefficients corresponding to a respective time/frequency span;

determining a respective kurtosis value for each set of wavelet coefficients wherein said kurtosis value is determined for each of the wavelet coefficient sets as a function of the coefficient values within each wavelet coefficient set;

comparing each respective kurtosis value with a predetermined kurtosis threshold; and re-synthesizing a new time-domain signal using an inverse wavelet transform applied to selected ones of said sets of wavelet coefficients for which said respective kurtosis values are less than said predetermined kurtosis threshold.

6. Apparatus for impulsive and non-impulsive signal separation of an input signal, comprising:

a wavelet transformer decomposing said input signal into a plurality of wavelet coefficient sets;

a kurtosis value calculator calculating a kurtosis value for each wavelet coefficient set wherein said kurtosis value is determined for each of the wavelet coefficient sets as a function of the coefficient values within each wavelet coefficient set;

a classifier identifying an impulsive group of wavelet coefficient sets and a non-impulsive group of wavelet coefficient sets in response to said kurtosis values; and an inverse wavelet transformer for synthesizing an output signal from one of said groups of wavelet coefficient sets.

7. The apparatus of claim 6 wherein said classifier identifies said impulsive group of wavelet coefficient sets as those having kurtosis values greater than a predetermined kurtosis threshold and identifies said non-impulsive group of wavelet coefficient sets as those having kurtosis values less than said predetermined kurtosis threshold.

8. The apparatus of claim 7 further including a second inverse wavelet transformer for synthesizing a second output signal from the other one of said groups of wavelet coefficient sets.

9. Apparatus for removing background noise from an input signal, comprising:

a data memory storing samples of said input signal;

a wavelet transformer coupled to said data memory decomposing said samples of said input signal into a plurality of wavelet coefficient sets;

a kurtosis value calculator calculating a kurtosis value for each wavelet coefficient set wherein said kurtosis value is determined for each of the wavelet coefficient sets as a function of the coefficient values within each wavelet coefficient set;

a classifier comparing respective kurtosis values calculated for each respective wavelet coefficient set with a predetermined kurtosis threshold; and an inverse wavelet transformer for synthesizing an output signal including substantially only those wavelet coefficient sets for which said respective kurtosis values are not less than said predetermined kurtosis threshold, whereby said output signal represents said input signal with background noise removed.

10. The apparatus of claim 9 further comprising output means coupled to said inverse wavelet transformer for playing back said output signal.

11. The apparatus of claim 10 wherein said output signal is an audio signal and wherein said output means is comprised of an audio transducer.

12. The apparatus of claim 10 wherein said output signal is a video signal and wherein said output means is comprised of a video display.

* * * * *